United States Patent [19]

Schouhamer Immink et al.

[11] Patent Number: 4,593,395
[45] Date of Patent: Jun. 3, 1986

[54] ERROR CORRECTION METHOD FOR THE TRANSFER OF BLOCKS OF DATA BITS, A DEVICE AND PERFORMING SUCH A METHOD, A DECODER FOR USE WITH SUCH A METHOD, AND A DEVICE COMPRISING SUCH A DECODER

[75] Inventors: Kornelis A. Schouhamer Immink; Lodewijk B. Vries, both of Eindhoven, Netherlands

[73] Assignee: U.S. Philips Corporation, New York, N.Y.

[21] Appl. No.: 758,587

[22] Filed: Jul. 25, 1985

Related U.S. Application Data

[63] Continuation of Ser. No. 459,088, Jan. 19, 1983, abandoned, which is a continuation-in-part of Ser. No. 393,940, Jun. 30, 1982, Pat. No. 4,477,903.

[30] Foreign Application Priority Data

Jan. 21, 1982 [NL] Netherlands .................. 8200207

[51] Int. Cl.⁴ ............................................. G06F 11/10
[52] U.S. Cl. .................................................. 371/40
[58] Field of Search ........................ 371/37, 38, 39, 40

[56] References Cited

U.S. PATENT DOCUMENTS 4,238,852 12/1980 Iga et al. ................................ 371/40
4,281,355 7/1981 Wada et al. ........................... 371/40
4,306,305 12/1981 Doi et al. ............................... 371/38
4,356,564 10/1982 Doi et al. ............................... 371/40

Primary Examiner—Charles E. Atkinson
Attorney, Agent, or Firm—Jack E. Haken; James J. Cannon, Jr.

[57] ABSTRACT

For an error correction method for the transfer of word-wise arranged data, two word correction codes are used successively, each code acting on a group of words while, therebetween, an interleaving step is performed. The actual transfer takes place by means of channel words for which purpose there are provided a modulator and a demodulator. Invalid channel words are provided with an invalidity bit in the demodulator. During the (possibly correcting) reproduction of the data words, the invalidity bits can be used in one of the two error corrections in various ways:

(a) When too many words of a group of code words are invalid, all words of the relevant group are invalidated;

(b) If a word comprising an invalidity bit is not corrected during correction by means of a syndrome variable, all words of the relevant group are invalidated;

(c) If the number of invalidity bits lies within given limits, they act as error locators so that the code is capable of correcting a larger number of words.

6 Claims, 5 Drawing Figures $$[H] = \begin{pmatrix} 1 & 1 & 1 & \cdots & 1 & 1 \\ a^1 & a^{1.2} & a^{1.3} & \cdots & a^{n-1} & a^n \\ a^2 & a^{2.2} & a^{2.3} & \cdots & a^{2(n-1)} & a^{2.n} \\ a^3 & a^{3.2} & a^{3.3} & \cdots & a^{3(n-1)} & a^{3.n} \\ \vdots & \vdots & \vdots & & & \\ a^{(k-1)} & a^{(k-1)2} & a^{(k-1)3} & \cdots & a^{(k-1)(n-1)} & a^{(k-1)n} \end{pmatrix}$$

ERROR CORRECTION METHOD FOR THE TRANSFER OF BLOCKS OF DATA BITS, A DEVICE AND PERFORMING SUCH A METHOD, A DECODER FOR USE WITH SUCH A METHOD, AND A DEVICE COMPRISING SUCH A DECODER

This is a continuation of application Ser. No. 459,088, filed Jan. 19, 1983, now abandoned, which is a continuation-in-part of Ser. No. 393,940, filed June 30, 1982, now U.S. Pat. No. 4,477,903, issued Oct. 16, 1984.

BACKGROUND OF THE INVENTION

1. Field of the Invention

The invention relates to an error correction method for the transfer of word-wise arranged data, comprising the following steps:

a. receiving a succession of first numbers of data words in a first error encoder and adding to each first number of data words a first series of parity words on the basis of a first generator matrix of a first work correction code;

b. interleaving said first numbers of data words and first series of parity words by means of respective delay times which are all different within each first number and associated first series in order to form a succession of second numbers of words, each second number of words having a number of data words equal to said first number plus a number of check words equal to the number in a first series;

c. receiving a second number of words of said succession in a second error encoder and adding to said second number of words a second series of parity words on the basis of a second generator matrix of a second work correction code so as to form a third number of words;

d. word-by-word modulation of said third numbers of words serially linked in order to form channel words which satisfy, by way of added redundancy, predetermined upper limits and lower limits for the admissible intervals between directly successive signal transitions, said channel words being serially concatenated and pair-wise separated by merging bits which in combination with the channel words also satisfy said upper limits and lower limits in conjunction therewith;

e. demodulation of the channel words and merging bits after the transfer in order to reconstruct said third numbers of words;

f. receiving said third numbers of words, and from each third number reproducing, and if possible and necessary, correcting said second numbers of words, on the basis of the second parity check matrix associated with the second generator matrix;

g. deinterleaving said second numbers of words, followed by the reproducing therefrom, and if possible and necessary, correcting said first numbers of data words for a user on the basis of the first parity check matrix associated with the first generator matrix.

2. Description of the Prior Art

Part of a transfer with error correction as set forth above has already been disclosed in U.S. patent application Ser. No. 265,465 filed May 20, 1981, now abandoned, which Application is based on a Japanese Application No. 567608-80 in the name of Sony Corporation, Sinagawa-ku, Tokyo, Japan, and is incorporated herein by way of reference, although not by way of limitation. According to the prior art, within a second number of words, or within a third number of words, respective limited numbers of words can thus be corrected or a further limited number of words can be detected as being incorrect, said limited numbers being given by the minimum Hamming distance of the code taken over the words or symbols. This capability will be described in detail hereinafter. If the number of incorrect words within a second or third number of words is larger than the relevant admissible value, the error correction or the detection of incorrect words fails. When the error correction fails, either incorrect words are not corrected or words are incorrectly corrected, or both. If the error detection fails, either correct words are indicated as being incorrect or incorrect words are not indicated as being incorrect, or both. For completeness' sake it is mentioned that the prior art includes further interleaving steps before the first error encoding and between the second error encoding and the modulation. Furthermore, the modulation and demodulation has been described in British Patent Application No. 2083322 published Mar. 17, 1982. The modulation is a kind of coding for realizing a run-length-limited code; the transitions in the signal value are transitions from a channel bit having a first signal value to a channel bit having the second signal value.

SUMMARY OF THE INVENTION

It is an object of the invention to combine the redundancy introduced into the data transferred by the described modulation with the error correction codes proper, in order to enhance the overall error correction capability. Incorrectly demodulated words should function as indicators for a generally unreliable second number of words.

A first version of the method in accordance with the invention utilizes this principle and is characterized in that during the demodulation a first flag bit is added to the word of said third number of words which is formed from an unrecognizable channel word, a second flag bit being added to each word of the relevant second number of words during the reproduction of a said second number of words on the basis of the second parity check matrix, under the control of an excessive number of first flag bits within a said third number, in order to indicate the relevant second number of words as being generally unreliable. The invention is based on the recognition of the fact that during the transfer (via a broadcast channel, a communication link or a storage medium such as an optical storage disc or a magnetic tape), usually trains of disturbed channel words or burst errors occur which can impart an arbitrary content to a channel word. In such a case the result may be again a correct channel word. The invention is also based on the recognition of the fact that it is attractive to detect the error as soon as possible, that is to say before the first error correction. The redundancy introduced during modulation makes such detection possible. In the case described a limited number of words could be corrected. If more words are indicated as being incorrect, the correction is omitted in order to allow it to be performed, for example, only after de-interleaving. Thanks to the de-interleaving, a number of words which are indicated as being unreliable are spaced further apart, so that the local concentration of incorrect words is reduced in many cases. A further aspect of the foregoing is that the indication of incorrect channel words makes correction of a larger number of words possible: the method, for example, is capable of correcting four words localized as being incorrect. For safety reasons correction may still be undertaken in the case of three channel words indicated as being incorrect, but in the case of four incorrect channel words (which themselves are correctable) the second number of words is preferably indicated as being unreliable.

A second version of the method in accordance with the invention is characterized in that during the demodulation a first flag bit is added to the word of a said third number of words which is formed from an unrecognizable channel word, during the reproduction of a said second number of words on the basis of the second parity check matrix, under the control of the absence of a correction to be made in a word and a first flag bit indicating exactly that word, a second flag bit being added to each word of the relevant second number of words in order to indicate said second number of words as being generally unreliable. On the one hand, the number of words which can be corrected by means of the second error correction code is not increased; in accordance with the state of the art, this number equals two. On the other hand, however, the safety margin is increased.

Preferably, during the reproduction of said first number of data words on the basis of the first parity check matrix, under the control of an excessive further number of second flag bits within said second number a third flag bit is added to the relevant first number of data words in order to indicate said first number of data words as being generally unreliable. Thus, for the sake of safety a number of data words can be indicated as being generally unreliable also at the level of the first parity check matrix. For example, if the data transferred concerns digitized acoustic signals, an unrecognizable data word can be concealed in that the relevant acoustic signal sample is replaced by the directly preceding signal sample which is based on correct data words. This is referred to as "zero-order interpolation".

In the case of a systematic first error correction code, during the reproduction of a second first number of data words on the basis of the first parity check matrix under the control of the non-correction to be made in a word and a second flag bit which indicates exactly that word, preferably a third flag bit is added to each word of the relevant first number of data words in order to indicate said first number of data words as being generally unreliable. A step of the kind described can then also be taken at the level of the first error correction code. The term "systematic" is to be understood to concern herein the word level, so that in the correct condition of the code words each data word requires only one code word in order to be reproduced. Systematic at bit level means that an undisturbed code bit would be 1 to 1 correlated with the associated data bit. Preferably, during the reproduction of a said first number of data words on the basis of the first parity check matrix use is made of a number of second flag bits which lies between predetermined limits in order to act as error locators for a correction to be performed. A second flag bit is thus attractively used to enhance the possibility of correction by the first error correction code. If the second error correction code is a systematic code at the word level, also the first flag bits may be used as further error locators, provided that their number within a third number of words lies between further predetermined limits. If such an error locator is encountered, the data content of the flagged word may be ignored, because the correction is done on the basis of words. This course of action with respect to the flagged word is called on "erasure" mode: the relevant word is considered as having no information content at all.

The invention also relates to a device for performing the described method, in which device the number of merging bits amounting to three and said upper limit and lower limit being eleven and three channel bits, respectively. It has been found that this is an attractive choice.

The invention also relates to a device for the decoding and demodulation of data transferred by means of the method, a non-correctable first number of data words then being replaced by substitute data. Such a concealment of an incorrect word has an adverse effect on the audio quality, but is far less detrimental than the risk of a clicking noise which is experienced as being very annoying by a listener.

The invention also relates to a decoder for use in a device of the described kind in which a group of synchronizing channel bits is ignored during the demodulation and a further group of control bits is ignored for the (possibly correcting) reproduction after demodulation. The synchronization can thus be readily implemented.

Furthermore, the further group of control bits may advantageously form part of a further error correcting code, wherein the redundancy is shared among a plurality of such further groups, also in this case, flags emanating from the demodulator, may be used either as an error locator, or as a signalization for an excessive number of errors in a plurality of such further groups.

BRIEF DESCRIPTION OF THE FIGURES

The invention will be described in detail hereinafter with reference to some Figures.

DESCRIPTION OF A PREFERRED EMBODIMENT

Figure 1:
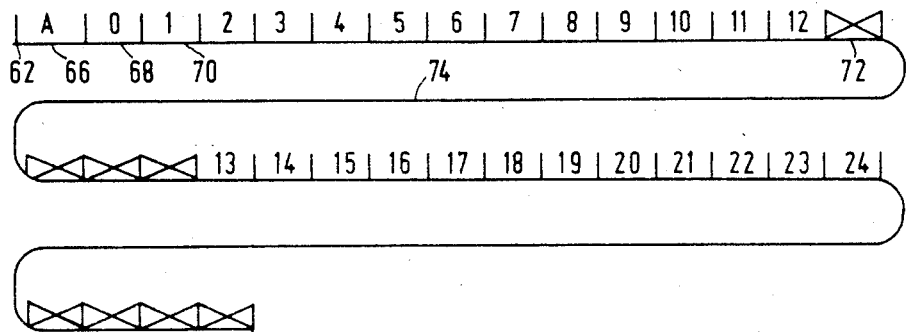
FIG. 1 is a diagram of a preferred configuration of the channel words.

FIG. 1 shows a preferred configuration in which the channel words are presented; the channel words are organized in blocks, one of which is shown. After the beginning at the indication 62, first a synchronization word A (66) is presented and subsequently a control word "0" (68). The further channel words are formed by means of systematic error correction codes in such manner that there are 24 non-redundant channel words (1–24), as indicated by the indication 70, and eight parity channel words which are each indicated by a cross, for example the channel word 72. The block terminates at the indication 64. The meandering line 74 indicates the time sequence. Actually, all channel words indicated directly succeed one another, be it that they are each followed by three merging bits. With the exception of the synchronization word 66, each channel word consists of fourteen channel bits. The number of directly successive channel bits of the same value is not smaller than three and not larger than eleven. It has been found that this results in 267 feasible combinations, 256 of which are used to represent respective 8-bit code words, the remaining eleven either not being used or being used for special purposes. The merging bits within the chain of channel words also satisfy the upper limits and lower limits imposed as regards the number of directly successive channel bits having mutually the same binary values.

Figures 2, 5:
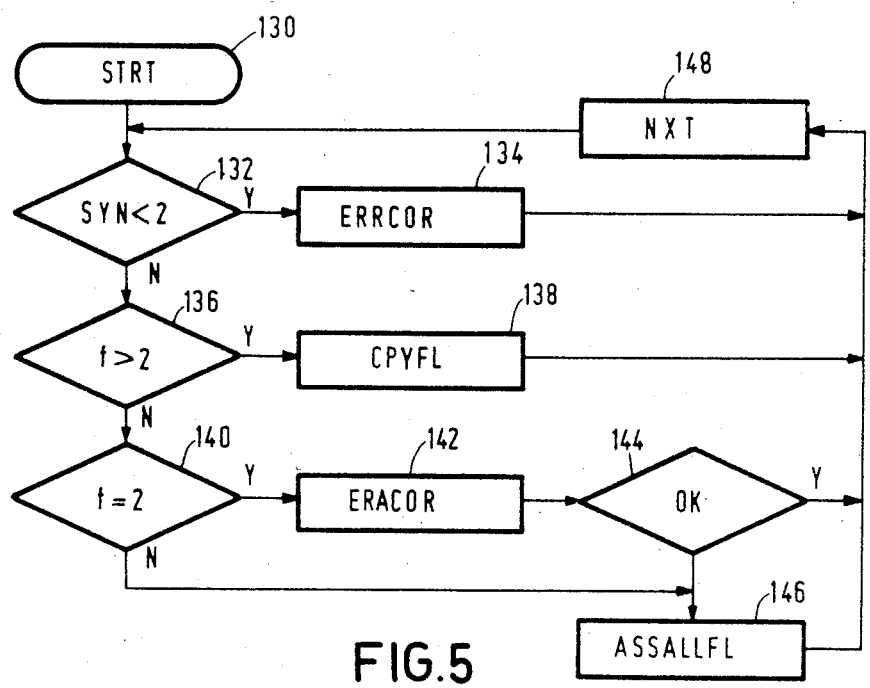
FIG. 2 shows a preferred parity check matrix (H)
FIG. 5 shows a flow chart relating to the first error correction code.

FIG. 2 shows a parity check matrix (H) of a word correction code to be used. The generator matrix (G) of this code is given in that the matrix product (G)·(H)=0. The number of columns of the matrix (H) equals the number od code words to be processed together. The number of rows of the matrix (H) equals the number of redundancy words included in the code words. It has previously been proposed to supplement a number of 24 data words with four redundancy words in a first error correction code in order to obtain 28 words. Subsequently, these groups of 28 words are interleaved in order to form as many second groups of words (also 28). Finally, four further redundancy words are added to said second numbers of words in a second error correction code in order to form a third number of words which words then are modulated in order to form as many channel words. For the first error correction code the number of columns of the parity check matrix then equals 28; for the second error correction code said number of columns equals 32. In both cases the number of rows of the matrix (H) equals four. The elements $a^o=1$, $a^1$ ... of the matrix (H) are elements of a Galois field $GF(2^m)$ which are generated by the associated primitive and irreducible generator polynomial. The number of bits of the relevant words is m, for which n $\leq 2^{m-1}$; in the present embodiment m=8. By addition of four redundant code words a minimum Hamming distance over the code words of five can be realized. Two incorrect code words can thus be corrected, without it being necessary to know which code words are incorrect. The redundancy offered by the four redundant words is then sufficient to represent the error vector (the error pattern) as well as the error locator for both words. When the error locator is known, knowing the error vector alone may be sufficient for correction of said incorrect word. When four words are incorrect whose error locator has been obtained in a different manner, a number of four redundant words suffices for the correction of those four incorrect words. If the error locator of two words is known, four redundant words are sufficient for correction of the relevant two words and also for localizing and correcting an incorrect word whose location need not be known. The same code is also capable of detecting four incorrect words. The sum of the number of incorrect words to be detected plus the sum of the number of incorrect words to be corrected whose location has become known in a different manner therefore equals four. For other codes built up in accordance with the restrictions described and involving different numbers of redundant words, corresponding numbers of detectable/correctable incorrect words are applicable.

Figure 3:
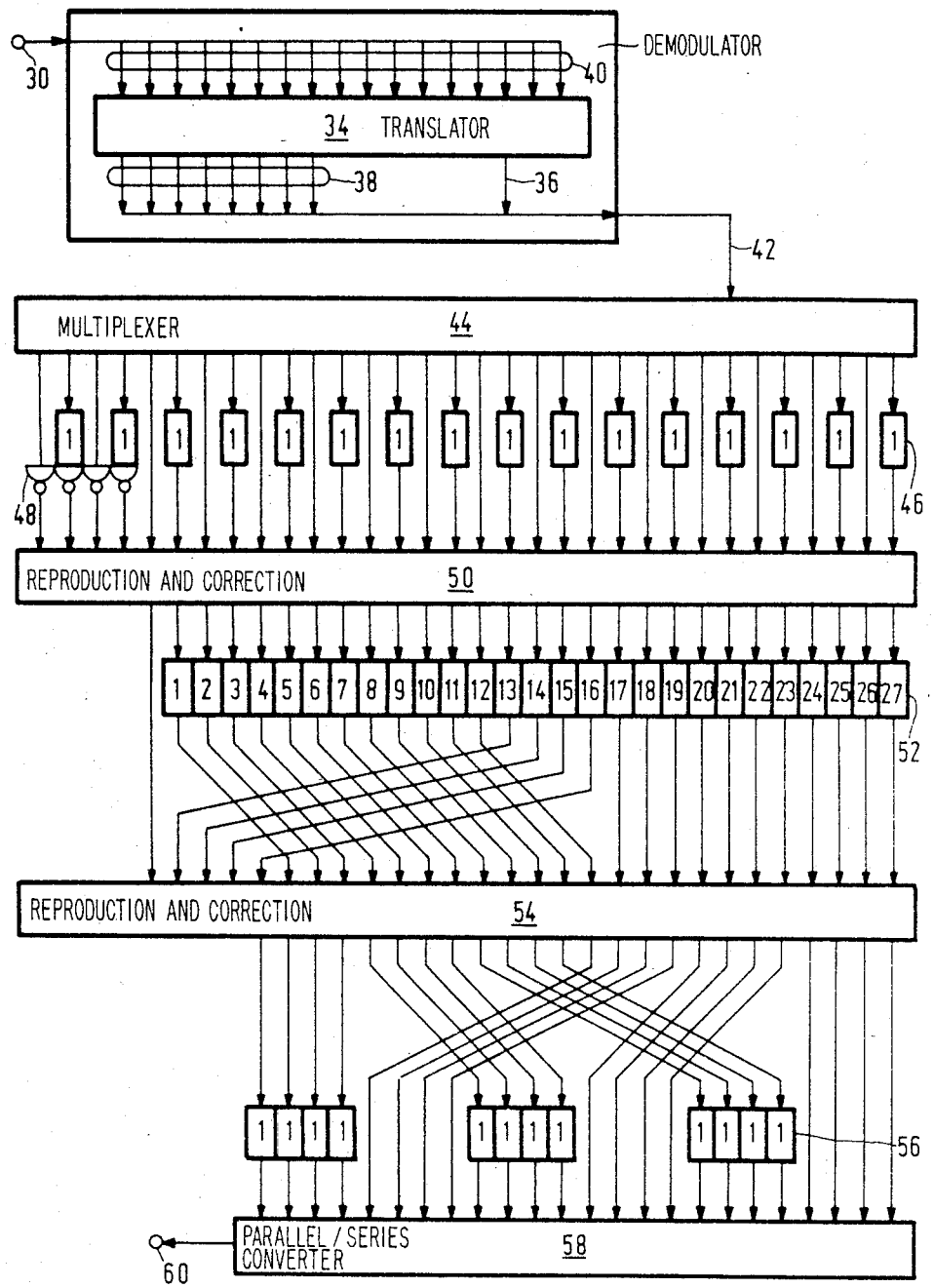
FIG. 3 is a block diagram of a decoder for use in accordance with the invention.

FIG. 3 shows a decoder for use with the invention. It is to be noted that the invention can be used in an encoder as described in said Netherlands Patent Application No. 8102441 which encoder, therefore, will not be elaborated upon herein. In the set-up shown in FIG. 3, the information of the channel words arrives on the input 30 in a bit serial manner. In the demodulator 32, first a series/parallel conversion takes place, so that a complete code word becomes available on the fourteen-fold connection 40. The actual series/parallel converter and the clock system required have been omitted for the sake of simplicity. Block 34 represents a translator which converts a correctly received fourteen-bit channel word into the corresponding 8-bit code word on the 8-fold connection 38 plus a binary "zero" on the single connection 36. Several possibilities exist when the channel word is not correct: first of all, an arabitrary word, for example "00000000", may be produced on the connection 38 and a logic "1" on the connection 36. Alternatively, the incorrect channel word may be translated into a correct channel word which corresponds as well as possible thereto and which is translated into the corresponding code word (obviously, this can be performed in one operation). Usually, a single-bit error in a channel word can be repaired; in cases where several code words can be formed with the same probability (the same Hamming distance between incorrect channel word and several correct channel words), one of these correction code words is chosen as a substitute in accordance with the foregoing. Multibit errors generally cannot be corrected in all cases. The translation of a correct channel word into the corresponding 8-bit demodulated word is subsequently performed; this translation may also be implicit, so that the demodulation is performed in a single stroke. Each time a channel word received is detected as being incorrect, the connection 36 carries a logic flag bit "1". It is alternatively possible to construct the line 36 to be multiple in order to indicate whether a channel word received was correct, or whether unambiguous correction was possible, or whether a substitute word has been chosen from several possible substitutes. In many cases an error is accompanied by further errors in neighboring code bits; this phenomenon is referred to as a burst error. Bit-wise correction of the code bits is then often impossible, and the bit on the connection 36 has the significance valid-/invalid. A "valid" code word, therefore, may very well be incorrect. In that case an 8-bit demodulated word appears serially or in parallel on the output 42 of the demodulator 32 in conjunction with at least one flag bit or validity bit. The block 34 may be constructed as a read-only memory with an address input having a width of 14 bits and an output data path having a width of 9 bits (or possibly more bits). The merging bits are ignored for the conversion into code bits. If desired, the merging bits may be taken into account for the formation of the valid/invalid bit, because they must also satisfy the modulation restriction. The merging bits may then be considered as forming part of the directly preceding channel word. The control word (68 in FIG. 1) is also presented to the input 30 as a 14-bit channel word (with merging bits), so that it can also be provided, if desired, with a valid/invalid bit. The synchronization word 66 and also the control word 68, however, are ignored for the error correction of the other words. Connections 36, 38 may have branchings off for forwarding the control words to a control device, but these elements have not been shown for brevity. Among themselves, the control words may be part of an error correcting code. The valid/invalid flag bit for the demodulated control word may be used in similar ways as the corresponding flag bits for the data are used, to be described hereinafter.

Most of the decoder is known from said state of the art. Block 44 represents a multiplexer which comprises one input 42 and thirty-two parallel outputs. Multiplexing is performed word-wise, so that each output receives one complete word, including the associated validity bit (bits). Blocks which are indicated by the numeral "1", for example the block 46, delay the words applied thereto by a time which corresponds to the period during which exactly 32 words, including the associated validity bit (bits), arrive on the connection 42. Elements such as the element 48 are inverters whereby the parity words of the second error correction code are bitwise inverted. Element 50 is the reproduction and correction element for the second error correction code for implementing the parity check matrix (with n=32) which is shown in FIG. 2. Without using the validity bits, two incorrectly received words can be corrected. The processing of the data within the element 50 will be described with reference to a flow chart. Thus, for every 32 words received from the element 44, twenty-eight 8-bit output words arrive on the output of the reproduction and correction element 50, each output word being accompanied by its own validity bit. A logic "0" indicates that the relevant word is reliable; a logic "1" indicates that the relevant word is unreliable. In given cases (see hereinafter), the entire group of 28 words is indicated as being generally unreliable, because all 28 words have a validity bit of the value "1". The data rate on the output (outputs) of the element 50, therefore, amounts to $28/32 = \frac{7}{8}$ times the word rate on the corresponding input (inputs) of the element 50. The blocks 52 which are denoted by the reference numerals 1 to 27 delay the words received in order to introduce a de-interleaving effect. A "1" in a block indicates a delay which corresponds to the period of time required for the outputting of exactly one group of 28 words by the element 50. An indication "14" indicates a period of time which corresponds to the outputting of fourteen of such successive groups. Each word of a group of 28 words outputted together by the element 50 is thus assigned to a relevant newly formed group of 28 words. The effect of a burst error is thus spread over a large time interval, so that it is ensured that generally each newly formed group of 28 words contains at the most a small number of incorrect words.

Element 54 is the reproduction and correction element for the first error correction code for implementing the parity check matrix (with n=28) which also corresponds to FIG. 2. Without using the validity bits, for K redundant words a number K/2 (when K is even; in this case K=4) of incorrect words received can be corrected. The data processing mechanism in the element 54 will be described hereinafter with reference to a flow chart. Thus, on the output of the reproduction and correction element 54 twenty-four 8-bit data words appear for each group of 28 (interleaved) input words, said data words being accompanied or not by a validity bit having the significance previously described. In some cases (see hereinafter) the entire group of 24 words is indicated as being generally unreliable, because all 24 words comprise a relevant validity bit having the value "1". The data rate on the output of the element 54, therefore, amounts to $24/32 = \frac{3}{4}$ times the word rate on the input of the element 50. Blocks which are indicated by a digit "2", for example the block 56, delay the words applied thereto by a time which corresponds to the period during which exactly 2×32 words, including the associated validity bit (bits) arrive on the connection 42. Block 58 is a parallel/series converter for presenting 24 words received in the correct sequence (i.e. inverted with respect to the series/parallel conversion between the input 30 and the connection 40) on the output 60 to a user device which is not shown. Thirty-two data bits (i.e. four data words) may form exactly one audio sample signal for stereo reproduction. Alternatively, the data words may represent computer programs, ASCII characters or other information for use in a professional, data processing, or consumer environments. Referring to the first audio definition, should one of the four data words be invalid, either the entire audio signal or a mono portion thereof may be declared invalid and be replaced by an interpolated signal which is derived from one or more neighboring audio signals. This is not elaborated upon in FIG. 3.

Figure 4:
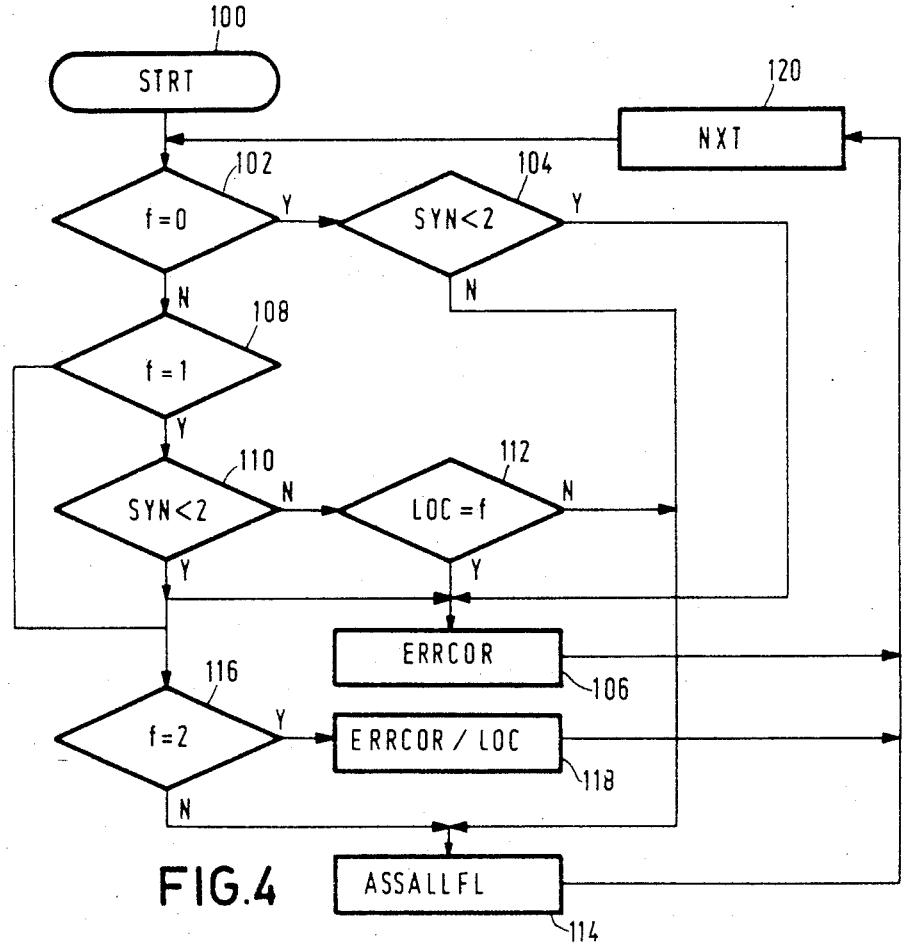
FIG. 4 shows a flow chart relating to the second error correction code.

FIG. 4 shows the processing of the data in the reproduction and correction element 50. The Figure is in the form of a flow chart and concerns a preferred embodiment. When a group of 32 words has been received, the processing may commence (block 100). In block 102 it is detected whether the number of invalid code words amounts to zero. If yes (Y), the multiplication by the parity check matrix is performed in block 104 in order to determine the syndrome variable. The syndrome variable (SYN) indicates whether the number of incorrect words amounts to 0, 1, 2 or more than two; if the number of incorrect words amounts to more than two, often a wrong number will be indicated. If the number of words indicated by the syndrome amounts to 0 or 1, the system proceeds to the block 106 in which the single incorrect word is corrected or a dummy error correction is performed in a conventional manner. If the number f of invalid code words amounts to one, first block 108 is reached, via block 102, and subsequently block 110. The operation in block 110 is the same as that in block 104. If it is detected in block 110 that one word is incorrect, the system goes to the block 106 (the case of zero incorrect words cannot occur unless, as previously described, the redundancy in the channel word has been used to correct a 1-bit error in a channel word) and the real or dummy correction is performed. If it is detected in the block 110 that there were two incorrect words, it is detected in block 112 whether one of the two error locators indicates the (one) invalid word. If this is so (Y), the system proceeds to the block 106 in order to perform the correction. If the invalid word is not indicated, correction is not possible and the system proceeds to block 114; this also takes place in the case of a negative (N) test result in the block 104. In the block 114, the validity bits of all words of the relevant group of words are set to "invalid". In block 112 a test for the detection of more than two incorrect words can be implicitly incorporated; this result again leads to the block 114. If the number of invalid words amounts to three or more, the system proceeds to the block 114 via the blocks 102, 108, 116 in order to declare all words of the group generally invalid. If in block 116 the number of invalid words amounts to exactly two, the relevant bits are used as error locators: using these error locators, the correction is performed in block 118. The syndrome may indicate that more than two words are incorrect, so that correction is not possible; in that case the system may proceed to the block 114, but this step is not shown separately. The outputs of the blocks 106, 114 and 118 lead to block 120. This block indicates that the next group of 32 code words must be loaded, because the error correction and reproduction of the 28 output words has been completed. The block 120 also comprises a "stop" output (not shown separately) for the case where no further words are received.

The formation of the syndrome variables in the blocks 104, 110 can be performed in known manner by multiplication of the 32 code words by the parity check matrix (H) previously described. The correction is now possible because the syndrome consists of four syndrome words. This result can be considered as four equations to be formed for producing four unknown variables when solved. These variables may be two error locators and two error vectors; two arbitrary words can thus be corrected. When a word is indicated as being invalid and this indication is accepted as an error locator variable, one additional (linear) equation is effectively formed, so that more unknowns could also be resolved (including the locator which is given by the invalidity bit).

The set-up of the block diagram of FIG. 4 may be modified. First of all, the case f=2 (block 116) can be treated in the same manner as the case f=1 (block 108). Secondly, the case f=3 or both cases f=3, 4 can be treated in the same way as the case shown in the block 116 in the Figure, so that the error locators are given by the invalidity bits. The case $f \geq 5$ must always be dealt with via the block 114.

It may also occur that a negative test result in the block 104 leads to the block 114, via error correction (like in the block 106), when the syndrome result indicates exactly two incorrect words. It is advantageous to set the invalidity bits of the corrected words to the state "valid" in the blocks 106, 118. Sometimes (notably in the block 118), however, the invalidity bits will not be modified. It may also be that the test in the block 102 is omitted, so that the system proceeds directly from the block 100 to the block 104.

FIG. 5 shows the processing of the data in the reproduction and correction element 54 of FIG. 3. This flow chart relates to a preferred embodiment. When a group of 28 words has been received, the processing may commence (block 130). In block 132, the multiplication by the parity check matrix is performed in order to determine the syndrome variable and it is also detected whether this syndrome variable SYN indicates that at the most one incorrect code word is present. If this test is affirmative (Y), the system proceeds to block 134 in which correction takes place, possibly a dummy correction. Any invalidity bit for the code word to be corrected is then set to the state "valid". When the syndrome variable indicates that more than one word is incorrect, it is tested in block 136 whether the number f of invalidity bits is larger than two. If this is the case (Y), no correction can take place and the invalidity bits received are copied on the output code words of the element 54 of FIG. 3. When the number of invalidity bits is smaller than three, it is tested in block 140 whether this number equals two. If this is so, the error is corrected in block 142. The result is tested in block 144. This result is incorrect if one or more words comprising an invalidity bit which indicates such "true" invalidity (compare the description of FIG. 4) are not corrected. In the case of a "pro forma" validity bit, the correction at this level may also be a dummy correction. If two incorrect words are indicated by the syndrome variable, the correction can be "directly" performed. If it is detected in the block 140 that the number of invalidity bits equals 0 or 1, the system proceeds to the block 146. This also takes place if an "impossible" correction as defined hereabove is detected in the block 144. In the block 146, an invalidity bit (1) is added to all words of the outgoing group of data words (24), so that it is indicated that an error must be concealed in another manner. The flow chart may be modified. For example, a second upper limit for the number of invalidity bits can also be detected in the block 136. If the number is larger than, for example, four, a fault of the entire system is indicated, and all words are indicated as being invalid. It is also possible to use the invalidity bits as error locators in a given range of values for the number of invalid code words as explained with reference to the block 118 of FIG. 4. However, this has been omitted from the Figure.

The outputs of the blocks 134, 138, 144, 146 in FIG. 5 are connected to the block 148 whose function corresponds to that of the block 120 in FIG. 4.

Other embodiments are also feasible within the scope of the invention. For example, the relevant delay times in elements 52 in FIG. 3 may all be chosen to be a factor 4 larger in the encoder/decoder.

What is claimed is:
1. An error correction device for the transfer of word-wise arranged data, comprising:
   (a) means for receiving a succession of first numbers of data words in a first error encoder and adding to each first number of data words a first series of parity words on the basis of a first generator matrix of a first word correction code;
   (b) means for interleaving said first numbers of data words and first series of parity words by means of respective delay times which are all different within each first number and associated first series in order to form a succession of second numbers of words, each second number of words having a number of data words equal to said first number plus a number of check words equal to the number in a first series;
   (c) means for receiving a second number of words of said succession in a second error encoder and adding to said second number of words a second series of parity words on the basis of a second generator matrix of a second word correction code so as to form a third number of words;
   (d) means for word-by-word modulation of said third numbers of words serially linked in order to form channel words for transfer, which satisfy, by way of added redundancy, predetermined upper limits and lower limits for the admissible intervals between directly successive signal transitions, said channel words being serially concatenated and pair-wise separated by merging bits which in combination with the channel words also satisfy said upper and lower limits;
   (e) means for demodulation of the channel words and merging bits after the transfer in order to reconstruct said third number of words (34);
   (f) means for receiving said third numbers of words, and from each third number reproducing, and if possible and necessary, correcting said second numbers of words (50), on the basis of the second parity check matrix associated with the second generator matrix;
   (g) means for de-interleaving (52) said second numbers of words, followed by the reproducing therefrom, and if possible and necessary, correcting said first numbers of data words for a user (54) on the basis of the first parity check matrix associated with the first generator matrix;
characterized in that said device further includes:
   means for adding a first flag bit during demodulation to the word of said third number of words which is formed from an unrecognizable channel word, a second flag bit being added (114) to each word of the relevant second number of words during the reproduction of a said second number of words on the basis of the second parity check matrix under the control of an excessive number of first flag bits (116) within a said third number, in order to indicate the relevant second number of words as being generally unreliable;

said second word correction code is a systematic code;

during the reproduction of said second number of words on the basis of the second parity check matrix use is made of a number of first flag bits which lies between further predetermined limits in order to act as further error locators for a correction to be executed.

2. An error correction device for the transfer of word-wise arranged data, comprising:

(a) means for receiving a succession of first numbers of data words in a first error encoder and adding to each first number of data words a first series of parity words on the basis of a first generator matrix of a first word correction code;

(b) means for interleaving said first numbers of data words and first series of parity words by means of respective delay times which are all different within each first number and associated first series in order to form a succession of second numbers of words, each second number of words having a number of data words equal to said first number plus a number of check words equal to the number in a first series;

(c) means for receiving a second number of words of said succession in a second error encoder and adding to said second number of words a second series of parity words on the basis of a second generator matrix of a second systematic word correction code so as to form a third number of words;

(d) means for word-by-word modulation of said third numbers of words serially linked in order to form channel words for transfer which satisfy, by way of added redundancy, predetermined upper limits and lower limits for the admissible intervals between directly successive signal transitions, said channel words being serially concatenated and pair-wise separated by merging bits which in combination with the channel words also satisfy said upper limits and lower limits;

(e) means for demodulation of the channel words and merging bits after the transfer in order to reconstruct said third numbers of words (34);

(f) means for receiving said third numbers of words, and from each third number reproducing and if possible and necessary, correcting said second numbers of words on the basis of the second parity check matrix associated with the second generator matrix (50);

(g) means for de-interleaving said second numbers of words (52), followed by the reproducing therefrom, and if possible and necessary, correcting said first numbers of data words for a user (54) on the basis of the first parity check matrix associated with the first generator matrix;

characterized in that said device further including:

means for adding a first flag bit during demodulation to the word of said third number of words which is formed from an unrecognizable channel word, during the reproduction of a second number of words on the basis of the second parity check matrix, under the control of the absence of a correction to be made in a word and a first flag bit (112) indicating exactly that word, a second flag bit being added (114) to each word of the relevant second number of words in order to indicate said second number of words as being generally unreliable;

said second word correction code is a systematic code;

during the reproduction of said second number of words on the basis of the second parity check matrix use is made of a number of first flag bits which lies between further predetermined limits in order to act as further error locators for a correction to be executed.

3. An error correction device for the transfer of word-wise arranged data, comprising:

(a) means for receiving a succession of first numbers of data words in a first error encoder and adding to each first number of data words a first series of parity words on the basis of a first generator matrix of a first word correction code;

(b) means for interleaving said first numbers of data words and first series of parity words by means of respective delay times which are all different within each first number and associated first series in order to form a succession of second numbers of words, each second number of words having a number of data words equal to said first number plus a number of check words equal to the number in a first series;

(c) means for receiving a second number of words of said succession in a second error encoder and adding to said second number of words a second series of parity words on the basis of a second generator matrix of a second word correction code so as to form a third number of words;

(d) means for word-by-word modulation of said third numbers of words serially linked in order to form channel words for transfer, which satisfy, by way of added redundancy, predetermined upper limits and lower limits for the admissible intervals between directly successive signal transitions, said channel words being serially concatenated and pair-wise separated by merging bits which in combination with the channel words also satisfy said upper and lower limits;

(e) means for demodulation of the channel words and merging bits after the transfer in order to reconstruct said third number of words (34);

(f) means for receiving said third numbers of words, and from each third number reproducing, and if possible and necessary, correcting said second numbers of words (50), on the basis of the second parity check matrix associated with the second generator matrix;

(g) means for de-interleaving (52) said second numbers of words, followed by the reproducing therefrom, and if possible and necessary, correcting said first numbers of data words for a user (54) on the basis of the first parity check matrix associated with the first generator matrix;

characterized in that said device further includes:

means for adding a first flag bit during demodulation to the word of said third number of words which is formed from an unrecognizable channel word, a second flag bit being added (114) to each word of the relevant second number of words during the reproduction of a said second number of words on the basis of the second parity check matrix under the control of an excessive number of first flag bits (116) within a said third number, in order to indicate the relevant second number of words as being generally unreliable;

comprising serial-to-parallel by word conversion means fed by the output of a demodulation device and parallel-by-word-to-serial reconversion means feeding a user attachment of the device.

4. An error correction device for the transfer of word-wise arranged data, comprising:
  (a) means for receiving a succession of first numbers of data words in a first error encoder and adding to each first number of data words a first series of parity words on the basis of a first generator matrix of a first word correction code;
  (b) means for interleaving said first numbers of data words and first series of parity words by means of respective delay times which are all different within each first number and associated first series in order to form a succession of second numbers of words, each second number of words having a number of data words equal to said first number plus a number of check words equal to the number in a first series;
  (c) means for receiving a second number of words of said succession in a second error encoder and adding to said second number of words a second series of parity words on the basis of a second generator matrix of a second systematic word correction code so as to form a third number of words;
  (d) means for word-by-word modulation of said third numbers of words serially linked in order to form channel words for transfer which satisfy, by way of added redundancy, predetermined upper limits and lower limits for the admissible intervals between directly successive signal transitions, said channel words being serially concatenated and pair-wise separated by merging bits which in combination with the channel words also satisfy said upper limits and lower limits;
  (e) means for demodulation of the channel words and merging bits after the transfer in order to reconstruct said third numbers of words (34);
  (f) means for receiving said third numbers of words, and from each third number reproducing and if possible and necessary, correcting said second numbers of words on the basis of the second parity check matrix associated with the second generator matrix (50);
  (g) means for de-interleaving said second numbers of words (52), followed by the reproducing therefrom, and if possible and necessary, correcting said first numbers of data words for a user (54) on the basis of the first parity check matrix associated with the first generator matrix;

characterized in that said device further including:
  means for adding a first flag bit during demodulation to the word of said third number of words which is formed from an unrecognizable channel word, during the reproduction of a second number of words on the basis of the second parity check matrix, under the control of the absence of a correction to be made in a word and a first flag bit (112) indicating exactly that word, a second flag bit being added (114) to each word of the relevant second number of words in order to indicate said second number of words as being generally unreliable;

comprising serial-to-parallel by word conversion means fed by the output of a demodulation device and parallel-by-word-to-serial reconversion means feeding a user attachment of the device.

5. An error correction device for the transfer of word-wise arranged data, comprising:
  (a) means for receiving a succession of first numbers of data words in a first error encoder and adding to each first number of data words a first series of parity words on the basis of a first generator matrix of a first word correction code;
  (b) means for interleaving said first numbers of data words and first series of parity words by means of respective delay times which are all different within each first number and associated first series in order to form a succession of second numbers of words, each second number of words having a number of data words equal to said first number plus a number of check words equal to the number in a first series;
  (c) means for receiving a second number of words of said succession in a second error encoder and adding to said second number of words a second series of parity words on the basis of a second generator matrix of a second word correction code so as to form a third number of words;
  (d) means for word-by-word modulation of said third numbers of words serially linked in order to form channel words for transfer, which satisfy, by way of added redundancy, predetermined upper limits and lower limits for the admissible intervals between directly successive signal transitions, said channel words being serially concatenated and pair-wise separated by merging bits which in combination with the channel words also satisfy said upper and lower limits;
  (e) means for demodulation of the channel words and merging bits after the transfer in order to reconstruct said third number of words (34);
  (f) means for receiving said third numbers of words, and from each third number reproducing, and if possible and necessary, correcting said second numbers of words (50), on the basis of the second parity check matrix associated with the second generator matrix;
  (g) means for de-interleaving (52) said second numbers of words, followed by the reproducing therefrom, and if possible and necessary, correcting said first numbers of data words for a user (54) on the basis of the first parity check matrix associated with the first generator matrix;

characterized in that said device further includes:
  means for adding a first flag bit during demodulation to the word of said third number of words which is formed from an unrecognizable channel word, a second flag bit being added (114) to each word of the relevant second number of words during the reproduction of a said second number of words on the basis of the second parity check matrix under the control of an excessive number of first flag bits (116) within a said third number, in order to indicate the relevant second number of words as being generally unreliable;
  numbers of merging bits amounting to three and said upper limit and lower limit being eleven and three channel bits, respectively;

wherein for the demodulation a group of synchronizing bits, accompanying a third group of words, is ignored, while a further group of control bits, accompanying an associated group of synchronizing bits, is subject to an error correcting decoding as defined on a plurality of such groups of control bits, wherein the demodulator has a flag bit output for signalling an unrecognizable group of control bits.

6. An error correction device for the transfer of word-wise arranged data, comprising:
(a) means for receiving a succession of first numbers of data words in a first error encoder and adding to each first number of data words a first series of parity words on the basis of a first generator matrix of a first word correction code;
(b) means for interleaving said first numbers of data words and first series of parity words by means of respective delay times which are all different within each first number and associated first series in order to form a succession of second numbers of words, each second number of words having a number of data words equal to said first number plus a number of check words equal to the number in a first series;
(c) means for receiving a second number of words of said succession in a second error encoder and adding to said second number of words a second series of parity words on the basis of a second generator matrix of a second systematic word correction code so as to form a third number of words;
(d) means for word-by-word modulation of said third numbers of words serially linked in order to form channel words for transfer which satisfy, by way of added redundancy, predetermined upper limits and lower limits for the admissible intervals between directly successive signal transitions, said channel words being serially concatenated and pair-wise separated by merging bits which in combination with the channel words also satisfy said upper limits and lower limits;
(e) means for demodulation of the channel words and merging bits after the transfer in order to reconstruct said third numbers of words (34);
(f) means for receiving said third numbers of words, and from each third number reproducing and if possible and necessary, correcting said second numbers of words on the basis of the second parity check matrix associated with the second generator matrix (50);
(g) means for de-interleaving said second numbers of words (52), followed by the reproducing therefrom, and if possible and necessary, correcting said first numbers of data words for a user (54) on the basis of the first parity check matrix associated with the first generator matrix;
characterized in that said device further including:
means for adding a first flag bit during demodulation to the word of said third number of words which is formed from an unrecognizable channel word, during the reproduction of a second number of words on the basis of the second parity check matrix, under the control of the absence of a correction to be made in a word and a first flag bit (112) indicating exactly that word, a second flag bit being added (114) to each word of the relevant second number of words in order to indicate said second number of words as being generally unreliable;
numbers of merging bits amounting to three and said upper limit and lower limit being eleven and three channel bits, respectively;
wherein for the demodulation a group of synchronizing bits, accompanying a third group of words, is ignored, while a further group of control bits, accompanying an associated group of synchronizing bits, is subject to an error correcting decoding as defined on a plurality of such groups of control bits, wherein the demodulator has a flag bit output for signalling an unrecognizable group of control bits.

* * * * *